United States Patent
Yoshida

(10) Patent No.: US 10,609,823 B2
(45) Date of Patent: Mar. 31, 2020

(54) METHOD FOR MANUFACTURING MULTILAYER WIRING BOARD

(71) Applicant: Hitachi Chemical Company, Ltd., Tokyo (JP)

(72) Inventor: Nobuyuki Yoshida, Tokyo (JP)

(73) Assignee: HITACHI CHEMICAL COMPANY, LTD., Tokyo (JP)

(*) Notice: Subject to any disclaimer, the term of this patent is extended or adjusted under 35 U.S.C. 154(b) by 226 days.

(21) Appl. No.: 15/564,157

(22) PCT Filed: Nov. 24, 2015

(86) PCT No.: PCT/JP2015/082926
§ 371 (c)(1),
(2) Date: Oct. 3, 2017

(87) PCT Pub. No.: WO2016/163049
PCT Pub. Date: Oct. 13, 2016

(65) Prior Publication Data
US 2018/0084651 A1 Mar. 22, 2018

(30) Foreign Application Priority Data
Apr. 8, 2015 (JP) .................... 2015-079257

(51) Int. Cl.
*C23C 18/38* (2006.01)
*H05K 3/40* (2006.01)
(Continued)

(52) U.S. Cl.
CPC ....... *H05K 3/4076* (2013.01); *C23C 18/1653* (2013.01); *C23C 18/30* (2013.01);
(Continued)

(58) Field of Classification Search
CPC . H01R 12/04; H05K 1/09; H05K 1/11; H05K 3/30; H05K 3/0026; H05K 3/0038;
(Continued)

(56) References Cited

U.S. PATENT DOCUMENTS 7,230,188 B1 * 6/2007 En ..................... C23C 18/1607
174/257
8,003,896 B2 * 8/2011 Wu ..................... H05K 1/115
174/260
(Continued)

FOREIGN PATENT DOCUMENTS

JP   S57-197897 A   12/1982
JP   2011-017036 A   1/2001
(Continued)

OTHER PUBLICATIONS

International Search Report for PCT/JP2015/082926 dated Feb. 16, 2016; English translation submitted herewith (5 pages).

*Primary Examiner* — Carl J Arbes
(74) *Attorney, Agent, or Firm* — Fitch, Even, Tabin & Flannery, LLP

(57) ABSTRACT

A method for manufacturing a multilayer wiring board includes a step (1) and a step (2). The step (1) disposes a hole for through-hole, a squirt of metal foils, and a lower space. The squirt of the metal foils on both the sides of the insulating layer is formed at an opening of the hole for through-hole. The lower space is formed between the squirt of the metal foils and an inner wall of the hole for through-hole. The step (2) plugs up the hole for through-hole by forming an electrolytic filled plating layer at an inside of the hole for through-hole and on the metal foils on both the sides of the insulating layer. The plugging of the hole for through-hole in the step (2) is performed by once decreasing a current density of an electrolytic filled plating in a middle of the (Continued)

electrolytic filled plating and then increasing the current density again.

8 Claims, 2 Drawing Sheets

(51) Int. Cl.
- *C25D 21/12* (2006.01)
- *C25D 7/00* (2006.01)
- *C23C 18/16* (2006.01)
- *H05K 3/42* (2006.01)
- *C25D 5/18* (2006.01)
- *C23C 18/30* (2006.01)
- *H05K 3/00* (2006.01)
- *H05K 3/46* (2006.01)
- *C25D 3/38* (2006.01)

(52) U.S. Cl.
CPC ............... *C23C 18/38* (2013.01); *C25D 5/18* (2013.01); *C25D 7/00* (2013.01); *C25D 21/12* (2013.01); *H05K 3/0026* (2013.01); *H05K 3/423* (2013.01); *H05K 3/4644* (2013.01); *C25D 3/38* (2013.01); *H05K 3/0038* (2013.01); *H05K 3/427* (2013.01); *H05K 2203/0723* (2013.01); *H05K 2203/107* (2013.01); *H05K 2203/1476* (2013.01)

(58) Field of Classification Search
CPC ...... H05K 3/4076; H05K 3/423; H05K 3/427; H05K 3/4644; H05K 2203/0723; H05K 2203/107; H05K 2203/1476; C23C 18/1653; C23C 18/30; C23C 18/38; C25D 3/38; C25D 5/18; C25D 7/00; C25D 21/12

See application file for complete search history.

(56) References Cited

U.S. PATENT DOCUMENTS

| | | | | |
|---|---|---|---|---|
| 8,112,884 | B2* | 2/2012 | Tullidge | H05K 1/0206 174/262 |
| 8,197,659 | B2* | 6/2012 | Nakai | C25D 5/02 205/125 |
| 8,367,943 | B2* | 2/2013 | Wu | H05K 1/115 174/260 |
| 8,383,950 | B1* | 2/2013 | Huemoeller | H05K 3/428 106/1.18 |
| 8,440,916 | B2* | 5/2013 | Li | H05K 3/0032 174/263 |
| 8,592,691 | B2* | 11/2013 | Furuta | C23F 1/02 174/250 |
| 2003/0102223 | A1* | 6/2003 | Shimo | H05K 3/423 205/125 |
| 2016/0249463 | A1 | 8/2016 | Yoshida | |

FOREIGN PATENT DOCUMENTS

| | | |
|---|---|---|
| JP | 2003-168860 A | 6/2003 |
| JP | 2005-320631 A | 11/2005 |
| JP | 2009021581 A | 1/2009 |
| JP | 4256603 B2 | 4/2009 |
| JP | 2009-141049 A | 6/2009 |
| JP | 2009141049 A * | 6/2009 |
| JP | 2010-232590 A | 10/2010 |
| JP | 2014-095104 A | 5/2014 |
| WO | 2015/053083 A1 | 4/2015 |

* cited by examiner

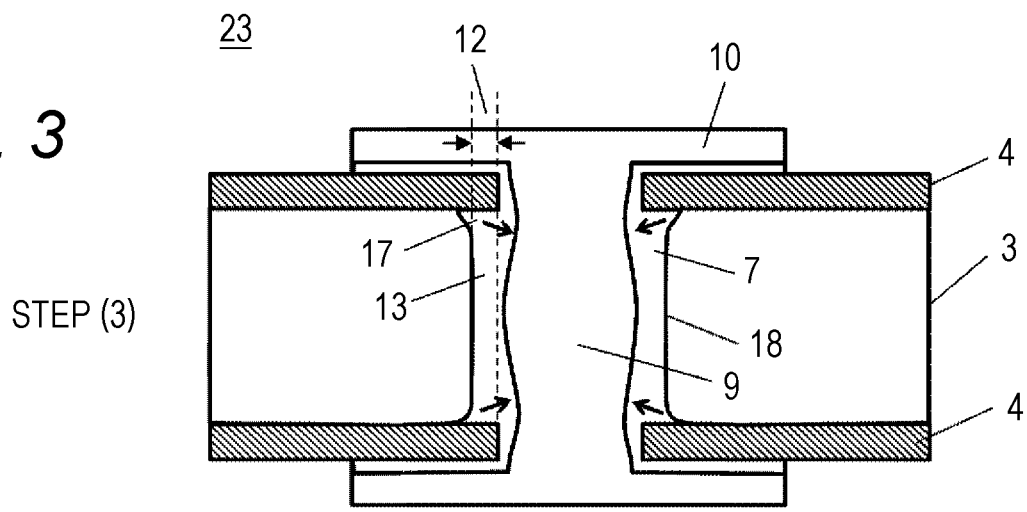
FIG. 3 STEP (3)
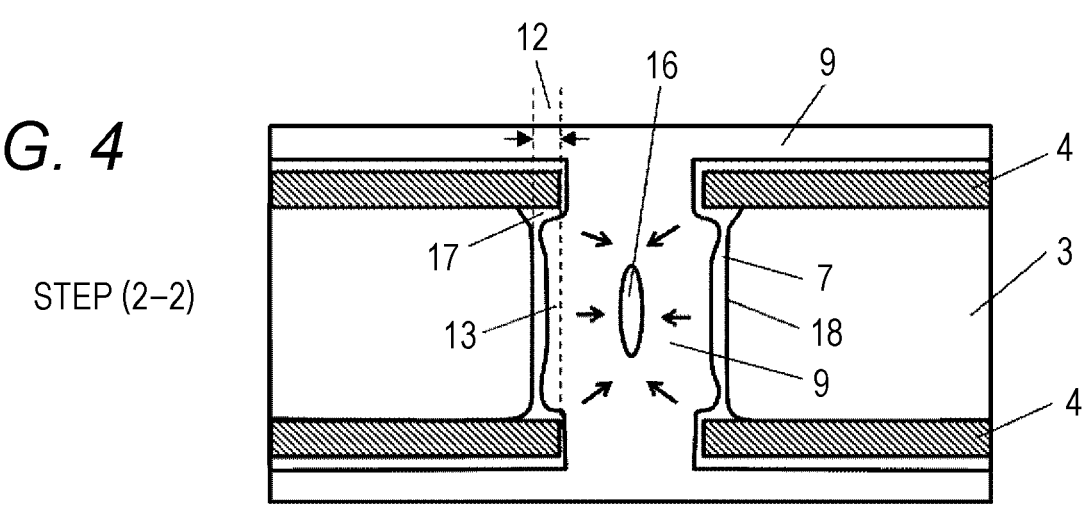
FIG. 4 STEP (2-2)
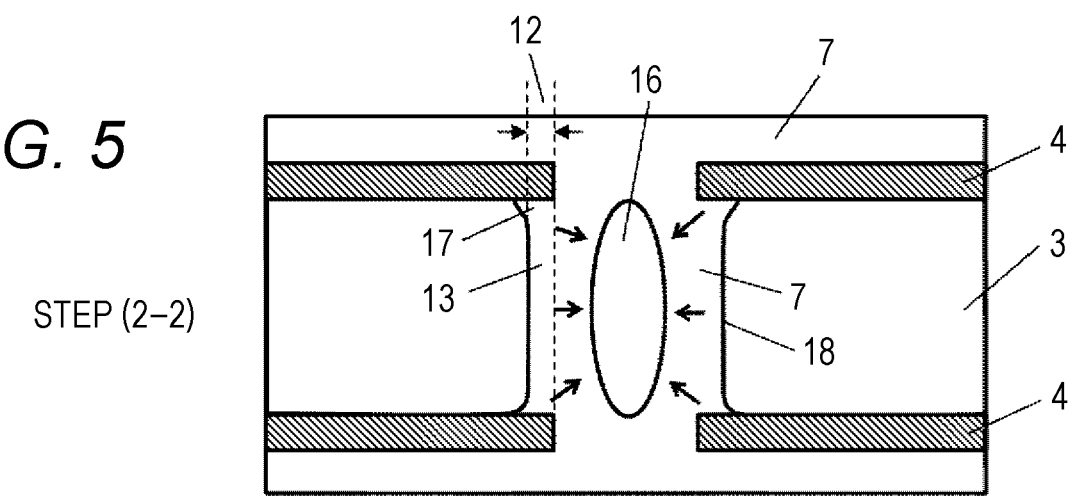
FIG. 5 STEP (2-2)

METHOD FOR MANUFACTURING MULTILAYER WIRING BOARD

CROSS-REFERENCE TO RELATED APPLICATIONS

This application is a U.S. national phase application filed under 35 U.S.C. § 371 of International Application No. PCT/JP2015/082926, filed Nov. 24, 2015, designating the United States, which claims benefit of the filing date of JP 2015-079257, filed Apr. 8, 2015, which is hereby incorporated herein by reference in its entirety.

TECHNICAL FIELD

The present invention relates to a method for manufacturing a multilayer wiring board. The present invention especially relates to a method for manufacturing a multilayer wiring board that forms an interlaminar coupling using an electrolytic filled via plating solution.

BACKGROUND ART

Conventionally, the following method for manufacturing a multilayer wiring board is employed. A prepreg or a resin film and metal foils on both sides of the prepreg or the resin film are integrally laminated. A hole for via-hole is disposed by drilling or laser. A base electroless plating layer is formed. Afterwards, the hole for via-hole is plugged up with an electrolytic plating layer (hereinafter may be simply referred to as an "electrolytic filled plating layer") formed using an electrolytic filled via plating solution.

Recently, the following method for manufacturing a multilayer wiring board is also employed (Patent Literatures 1 and 2). A base electroless plating layer is formed. Afterwards, a via-hole (hereinafter may be simply referred to as a "through-hole") having a via-diameter smaller than an insulating layer thickness and passing through an insulating material integrally laminated with metal foils is plugged up using an electrolytic filled via plating solution.

CITATION LIST

Patent Literature

PATENT LITERATURE 1: Japanese Patent No. 4256603
PATENT LITERATURE 2: JP-A-2009-141049

SUMMARY OF INVENTION

Problems to be Solved by the Invention

A hole for via-hole formed by laser processing by a conformal method or a direct laser method generates a squirt (or projection) of a metal foil at an opening of the hole for via-hole, an inlet for the laser processing. By this projection of the metal foil, the opening possibly becomes narrower than the inside in the cross-sectional shape of the hole for via-hole. In the case where electrolytic filled plating is filled in such hole for via-hole, before the electrolytic filled plating is filled to the inside of the hole for via-hole, an electrolytic filled plating layer deposited on the projection of the metal foil at the opening covers the opening of the hole for via-hole. This results in one factor of generating a plating void.

Recently, requests for downsizing and thinning have been increased more and more; therefore, a diameter of a hole for via-hole tends to be smaller, an insulating layer thickness tends to be thinner, and an aspect ratio tends to be larger. Meanwhile, in the case where the via-hole (the through-hole) passing through the insulating material is formed by the laser processing, this projection of the metal foil at the opening becomes large relative to the diameter and a depth of the hole for through-hole, being likely to affect the generation of the plating void. The void generated inside the through-hole possibly generates a failure caused by long-time use or use under sever conditions.

Patent Literature 1 discloses a method for manufacturing a multilayer wiring board. This method forms a tapered through-hole from both sides of an opening to a center of an insulating material by laser processing. Thus, a copper plating is filled. This method allows for easily filling the through-hole with the copper plating. However, in this method as well, the projection of the metal foil at the opening affects the generation of the plating void.

An object of the present invention is to provide a method for manufacturing a multilayer wiring board. This manufacturing method allows for restraining a plating void in an electrolytic filled plating layer to a hole for through-hole having a diameter equivalent to or equal to or less than an insulating layer thickness and which is formed by laser processing.

Solutions to the Problems

The present invention relates to the following. 1. A method for manufacturing a multilayer wiring board including: a step (1) of disposing a hole for through-hole, a projection of metal foils, and a lower space, the hole for through-hole being formed on a metal foil-pasted laminated plate by a conformal method or a direct laser method, the metal foil-pasted laminated plate being formed by integrally laminating the metal foils on both sides of an insulating layer, the hole for through-hole passing through the metal foils on both the sides of the insulating layer and the insulating layer, the projection of the metal foils on both the sides of the insulating layer being formed at an opening of the hole for through-hole, the lower space being formed between the projection of the metal foils and an inner wall of the hole for through-hole; a step (2) of forming a through-hole by forming an electrolytic filled plating layer at an inside of the hole for through-hole and on the metal foils on both the sides of the insulating layer to plug up the hole for through-hole, the through-hole electrically connecting the metal foils on both the sides of the insulating layer mutually; and a step (3) of forming a wiring by a circuit process of the metal foils on both the sides of the insulating layer after the formation of the electrolytic filled plating layer, wherein the plugging of the hole for through-hole by the formation of the electrolytic filled plating layer in the step (2) is performed by once decreasing a current density of an electrolytic filled plating in a middle of the electrolytic filled plating and then increasing the current density again. 2. The method for manufacturing the multilayer wiring board according to a first aspect, wherein the current density of the electrolytic filled plating is once decreased in the step (2) at a timing when the lower space between the projection of the metal foils on both the sides of the insulating layer and the inner wall of the hole for through-hole is filled with the electrolytic filled plating layer and later than the filling, the projection being formed at the opening of the hole for through-hole in a cross-sectional shape of the through-hole. 3. The method for manufacturing the multilayer wiring board according to the first aspect or a second aspect, wherein the current density of the electrolytic filled plating is once decreased in the step (2) at a timing when the lower space between the projection of the metal foils on both the sides of the insulating layer and the inner wall of the hole for through-hole is filled with the electrolytic filled plating layer and before formation of a plating void, the projection being formed at the opening of the hole for through-hole. 4. The method for manufacturing the multilayer wiring board according to any one of the first aspect to a third aspect, wherein when the current density of the electrolytic filled plating is once decreased in the middle of the electrolytic filled plating in the step (2), a decrease rate of the current density is 50% or more of a decrease rate immediately before the decrease. 5. The method for manufacturing the multilayer wiring board according to any one of the first aspect to a fourth aspect, wherein when the current density of the electrolytic filled plating is once decreased in the middle of the electrolytic filled plating and then is increased again in the step (2), a current density is equal to or more than a current density immediately before the current density is once decreased.

Effects of the Invention

The present invention can provide a method for manufacturing a multilayer wiring board. This manufacturing method can restrain a plating void in an electrolytic filled plating layer also to a through-hole hole having a diameter equivalent to or equal to or less than an insulating layer thickness and which is formed by laser processing.

BRIEF DESCRIPTION OF THE DRAWINGS

FIG. 3 illustrates a step (3) of the method for manufacturing the multilayer wiring board of one embodiment (the first embodiment to the fifth embodiment) of the present invention.

FIG. 4 illustrates a step (2) of a method for manufacturing a multilayer wiring board of one embodiment (a sixth embodiment) of the present invention.

FIG. 5 illustrates a step (2) of a method for manufacturing a multilayer wiring board of Comparative Example 1.

DESCRIPTION OF EMBODIMENTS

Figure 1:
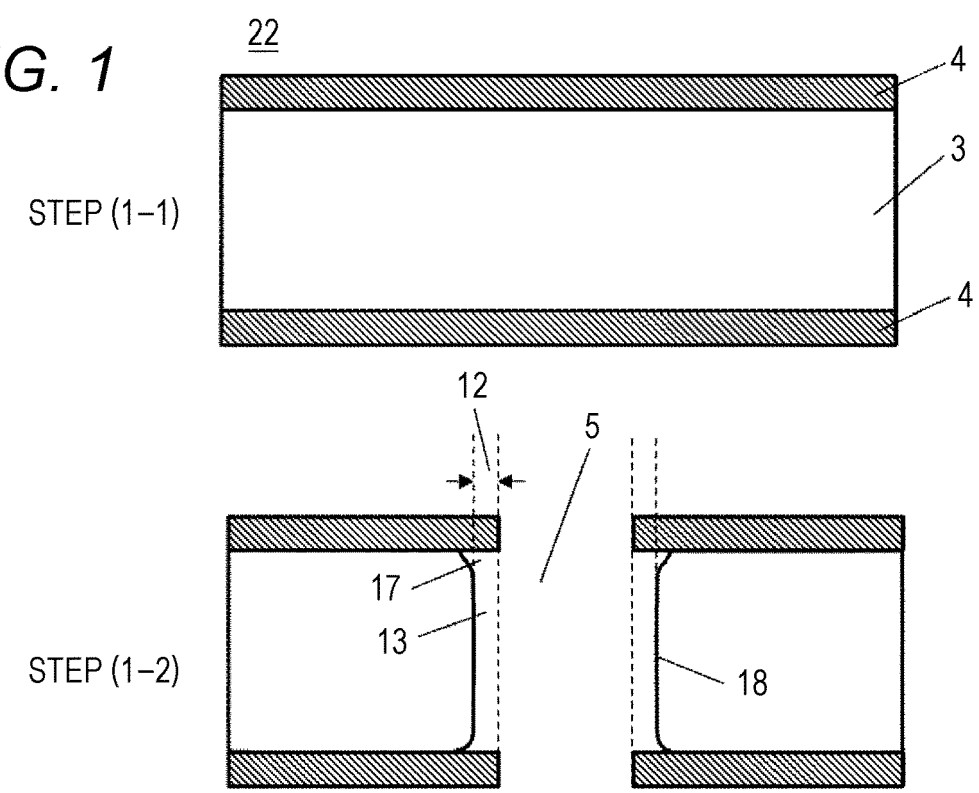
FIG. 1 illustrates a step (1) of a method for manufacturing a multilayer wiring board of one embodiment (a first embodiment to a fifth embodiment) of the present invention.

As a method for manufacturing a multilayer wiring board of the present invention, the following manufacturing method is listed. This manufacturing method includes: a step (1) of disposing a hole for through-hole, a projection of metal foils, and a lower space, the hole for through-hole being formed on a metal foil-pasted laminated plate by a conformal method or a direct laser method, the metal foil-pasted laminated plate being formed by integrally laminating the metal foils on both sides of an insulating layer, the hole for through-hole passing through the metal foils on both the sides of the insulating layer and the insulating layer, the projection of the metal foils on both the sides of the insulating layer being formed at an opening of the hole for through-hole, the lower space being formed between the projection of the metal foils and an inner wall of the hole for through-hole; a step (2) of forming a through-hole by forming an electrolytic filled plating layer at an inside of the hole for through-hole and on the metal foils on both the sides of the insulating layer to plug up the hole for through-hole, the through-hole electrically connecting the metal foils on both the sides of the insulating layer mutually; and a step (3) of forming a wiring by a circuit process of the metal foils on both the sides of the insulating layer after the formation of the electrolytic filled plating layer. The plugging of the hole for through-hole by the formation of the electrolytic filled plating layer in the step (2) is performed by once decreasing a current density of an electrolytic filled plating in a middle of the electrolytic filled plating and then increasing the current density again.

The method for manufacturing the multilayer wiring board of the present invention provides the hole for through-hole on the metal foil-pasted laminated plates formed by integrally laminating the metal foils on both sides of the insulating layer by a conformal method or a direct laser method at the step (1). This generates the projections of the metal foils on both sides of the insulating layer at the opening of the hole for through-hole. The lower space is formed between these projections of the metal foils on both sides of the insulating layer and the inner wall of the hole for through-hole. A just-below portion, which is a region near a back surface of the projections of the metal foils on both sides of the insulating layer, becomes a region where a liquid flow of electrolytic filled via plating solution is less likely to go round in the lower space. In view of this, an accelerator for the electrolytic filled via plating solution is likely to be absorbed to the lower space including this just-below portion. At an early stage of the electrolytic filled plating, first, starting from this just-below portion, the electrolytic filled plating layer is formed in the lower space to fill the lower space. Here, the lower space is a space surrounded by the projections of the metal foils on both sides of the insulating layer and the inner wall of the hole for through-hole. In detail, the lower space is a space surrounded by a straight line connecting mutual distal ends of the projections of the metal foils on both sides of the insulating layer and the inner wall of the hole for through-hole. Once the plating accelerator is absorbed, the plating accelerator has a property of staying while the electrolytic filled plating is continued at an identical current density. In view of this, like the prior art, in the case where the electrolytic filled plating is continued at the identical current density, a filled plating layer filled in the lower space continues growing starting from the just-below portion and covers the opening prior to the filling of the inside the hole for through-hole. This is likely to generate a plating void at the inside of the hole for through-hole.

The just-below portion is the region near the back surface of the projections of the metal foils on both sides of the insulating layer in the lower space, which is formed between the projections of the metal foils on both sides of the insulating layer and the inner wall of the hole for through-hole. In the case where the hole for through-hole is formed by the conformal method or the direct laser method, ease of the laser processing (a pyrolysis temperature) greatly differs between a resin forming the insulating layer and the metal foil disposed immediately above the insulating layer. In view of this, the inner wall of the insulating layer immediately below the metal foil is depressed more than the distal ends of the opening of the metal foils. Consequently, the above-described just-below portion is formed. Especially, in the case where a prepreg having a reinforcing fiber is used as the insulating layer, a resin for bonding is present at the just-below portion of the metal foil. This resin is easily laser-processed compared with the reinforcing fiber. In view of this, the resin of the just-below portion is likely to be depressed large compared with the metal foils and the inner wall inside the hole for through-hole. In view of this, since the accelerator for the electrolytic filled via plating solution is likely to be absorbed to this just-below portion, the electrolytic filled plating layer grows fast (thick) and is likely to cover the opening of the hole for through-hole.

According to the method for manufacturing the multilayer wiring board of the present invention, the current density of the electrolytic filled plating is once decreased in the middle of the electrolytic filled plating. In view of this, the accelerator absorbed to the electrolytic filled plating layer formed at the just-below portion in the lower space can be separated at this time. When the lower space is filed with the electrolytic filled plating layer at this time, the diameter of the inside of the hole for through-hole is smaller than the diameter (the diameter at a site where the electrolytic filled plating layer grows thick in the just-below portion) of the opening. In view of this, a plating inhibitor is likely to be absorbed to the opening of the hole for through-hole corresponding to the just-below portion. Meanwhile, the plating accelerator is likely to be absorbed to the inside of the hole for through-hole. In view of this, after the current density of the electrolytic filled plating is increased again, the growth of the electrolytic filled plating layer starting from the just-below portion is restrained. In view of this, the electrolytic filled plating layer is preferentially formed at the inside of the hole for through-hole without the electrolytic filled plating layer covering the opening of the hole for through-hole. Accordingly, this allows for restraining the plating void in the electrolytic filled plating layer also to the through-hole hole with the diameter equivalent to or smaller than the equivalent diameter of the insulating layer thickness.

A timing of once decreasing the current density of the electrolytic filled plating in the step (2) is set at or after a time point where the lower space between the projections of the metal foils on both sides of the insulating layer formed at the opening of the hole for through-hole and the inner wall of the hole for through-hole in the cross-sectional shape of the through-hole is filled with the electrolytic filled plating layer. Thus, in a state where the lower space is filled with the electrolytic filled plating layer, the diameter of the inside of the hole for through-hole is smaller than the diameter (the diameter of the site where the electrolytic filled plating layer grows thick in the just-below portion) of the opening. In view of this, the plating inhibitor can be more likely to be absorbed to the opening of the hole for through-hole, and the accelerator can be more likely to be absorbed to the inside of the hole for through-hole. Meanwhile, in a state before the lower space is filled with the electrolytic filled plating layer, the diameter of the inside of the hole for through-hole is larger than the diameter of the site where the electrolytic filled plating layer grows thick in the just-below portion. In view of this, the plating accelerator is likely to be absorbed on the electrolytic filled plating layer formed at the just-below portion in the lower space close to the opening, compared with on the electrolytic filled plating layer at the inside of the hole for through-hole. In view of this, the electrolytic filled plating layer at the just-below portion in the lower space continues growing and covers the opening. In view of this, the void is likely to occur.

A timing of once decreasing the current density of the electrolytic filled plating in the step (2) is set before the lower space between the projections of the metal foils on both sides of the insulating layer formed at the opening of the hole for through-hole and the inner wall of the hole for through-hole is filled with the electrolytic filled plating and the plating void is formed. In view of this, the inside of the hole for through-hole can be filled with the electrolytic filled plating layer with more certainty.

The decrease rate of the current density when the current density of the electrolytic filled plating is once decreased in the middle of the electrolytic filled plating in the step (2) is preferably 50% or more of the decrease rate immediately before the decrease. Here, the decrease rate of the current density is a proportion of decreasing the current density. For example, the decrease rate from the initial current density 1 $A/dm^2$ of 50% means that the current density after the decrease is 0.5 $A/dm^2$. Decreasing the current density includes setting the current density to 0 $A/dm^2$. Accordingly, the plating accelerator absorbed to the electrolytic filled plating layer formed at the just-below portion in the lower space can be reliably separated. In view of this, when the lower space is filled with the electrolytic filled plating layer, the diameter at the inside of the hole for through-hole is smaller than the diameter (including the diameter of the site where the electrolytic filled plating layer grows thick in the just-below portion) of the opening. In view of this, the plating inhibitor is more likely to be absorbed to the opening of the hole for through-hole. Meanwhile, the accelerator can be more likely to be absorbed to the inside of the hole for through-hole.

The current density when the current density of the electrolytic filled plating is once decreased in the middle of the electrolytic filled plating and then is increased again in the step (2) is preferably equal to or more than the current density immediately before the current density is once decreased. This allows the inside of the hole for through-hole to be filled with the electrolytic filled plating layer in a shorter period. This improves production efficiency.

In the case where, like the method for manufacturing the multilayer wiring board of the present invention, the current density is once decreased in the middle of electrolytic filled copper plating, a stripe is observed between an electrolytic filled copper plating layer on a first stage and an electrolytic filled copper plating layer on a second stage. This stripe ensures identification of a boundary between the electrolytic filled copper plating layer on the first stage and the electrolytic copper plating layer on the second stage. Consequently, whether the lower space is filled with the electrolytic filled copper plating layer on the first stage or not can be confirmed based on the cross-sectional shape of the through-hole. This facilitates management of the conditions for the electrolytic filled copper plating on the first stage and the thickness of the electrolytic filled copper plating layer on the first stage.

With the method for manufacturing the multilayer wiring board of the present invention, the number of decreases of the current density in the middle of the electrolytic filled copper plating once is not limited to one time but the decrease may be repeated to twice and three times. In this case, the respective thicknesses of the electrolytic filled plating on the first stage and the filled copper plating layers on the second stage and later stages are preferably regulated so as not to cause the void.

The metal foil-pasted laminated plate is used for a general inner layer of the multilayer wiring board. The metal foil-pasted laminated plates are generally formed by integrally laminating the metal foils on top surfaces or lower surfaces of the required number of prepregs (resin-impregnated base materials) produced by impregnating a resin composition in a reinforcing base material. The metal foil is made of a single, an alloy, or a composite foil of a copper, an aluminum, a brass, a nickel, an iron, and the like.

The prepreg becomes the insulating layer to which copper foils are bonded on both sides of the insulating layer. The prepreg is a resin film having adhesiveness formed by impregnating the resin composition (a resin varnish) in the glass fiber and the like as the reinforcing base material to produce the prepreg in half-hardened B stage. As the prepreg, the prepreg used for the general multilayer wiring board is applicable. In addition to the prepreg, a resin film that does not contain the reinforcing base material such as the glass fiber is also applicable. As such resin film that does not contain the reinforcing base material such as the glass fiber, a high polymer epoxy resin, a thermoplastic polyimide bonding film, and the like used for bonding of an inner layer material to the copper foils on both sides of the insulating layer in the multilayer wiring board are listed.

As the above-described resin composition, the publicly-known, traditional resin composition used as an insulating material for the multilayer wiring board is applicable. Usually, a thermosetting resin with good heat resistance and chemical resistance is used as the base. One kind or two kinds or more of mixed resins such as a phenol resin, an epoxy resin, a polyimide resin, an unsaturated polyester resin, a polyphenylene oxide resin, and a fluororesin is used. As necessary, an inorganic powder filler such as a talc, a clay, a silica, an alumina, a calcium carbonate, an aluminum hydroxide, an antimony trioxide, and an antimony pentoxide; or a fiber filler such as a glass fiber, an asbestos fiber, a pulp fiber, a synthetic fiber, and a ceramic fiber is added.

Taking a dielectric property, an impact resistance, film processability, and the like into consideration, a thermoplastic resin may be blended to the resin composition. Furthermore, as necessary, various additives or fillers such as an organic solvent, a flame retardant, a hardening agent, a hardening accelerator, thermoplastic particles, a colorant, an ultraviolet impermeable agent, an antioxidizing agent, and a reductant are added to be compounded.

As the above-described reinforcing base material, an inorganic fiber such as a glass and an asbestos; an organic fiber such as a polyester, a polyamide, a polyacryl, a polyvinyl alcohol, a polyimide, and a fluororesin; a woven fabric of a natural fiber such as a cotton, a nonwoven fabric, a paper, a mat, and the like are used.

Usually, the resin composition is impregnated into or applied to the reinforcing base material such that an amount of attachment of the resin composition to the reinforcing base material becomes 20 to 90 mass % by a resin content rate of the prepreg after drying. Afterwards, the prepreg is usually drying by heating at a temperature of 100 to 200° C. for 1 to 30 minutes. Thus, the half-hardened (B stage) prepreg is obtained. A structure of stacking the prepregs by usually 1 to 20 sheets and disposing the metal foils on both surfaces of the prepregs is heated and pressurized to integrally laminate the structure.

As molding conditions for the integral lamination, a usual method for the laminated plate is applicable. For example, a multiplaten press, a multiplaten vacuum press, a continuous molding, an autoclave molding machine, and the like are used. Usually, the molding is performed at the temperature of 100 to 250° C., the pressure of 2 to 100 kgf/cm$^2$ (196 kPa to 9.81 MPa), and the heating period in a range of 0.1 to 5 hours. Alternatively, using a vacuum lamination apparatus and the like, the molding is performed under lamination conditions of 50 to 150° C. and 0.1 to 5 MPa and under a condition of under decompression or atmospheric pressure. Although the thickness of the prepreg serving as the insulating layer differs depending on the application, the thickness is usually preferably 0.1 to 5.0 mm.

As the metal foil, the foil of the metal used for the general multilayer wiring board is applicable. Regarding surface roughness of the metal foil used for the present invention, both surfaces preferably have 10-point average roughness (Rz) described in JIS B0601 of 2.0 μm or less in terms of electric property. As the metal foil, while a copper foil, a nickel foil, an aluminum foil, and the like are applicable, the copper foil is usually used. As manufacturing conditions for the copper foil, in the case of a copper sulfate bath, the conditions of: the sulfuric acid of 50 to 100 g/L, the copper of 30 to 100 g/L, the liquid temperature of 20° C. to 80° C., and the current density of 0.5 to 100 A/dm$^2$ are generally used. In the case of a copper pyrophosphate bath, the conditions of: a potassium pyrophosphate of 100 to 700 g/L, the copper of 10 to 50 g/L, the liquid temperature of 30° C. to 60° C., pH of 8 to 12, and the current density of 1 to 10 A/dm$^2$ are often used generally. Taking the physical property of the copper and the smoothness into consideration, various additives are put in some cases.

A rustproofing treatment performed on a resin-bonded surface of the metal foil can be performed using any one of a nickel, a tin, a zinc, a chrome, a molybdenum, and a cobalt or an alloy of these materials. These materials form a thin film on the metal foil by sputtering, electroplating, or electroless plating. In terms of cost, the electroplating is preferable. Although an amount of metal for the rustproofing treatment differs depending on the type of the metal, 10 to 2,000 μg/dm$^2$ in total is preferable. The excessively thick rustproofing treatment results in inhibition of etching and deterioration of the electric property. The excessively thin rustproofing treatment possibly causes deterioration of peel strength with the resin. Furthermore, the formation of a chromate-treated layer on the rustproofing treatment can restrain the deterioration of the peel strength with the resin and therefore is effective.

The through-hole is an interlaminar coupling hole that passes through a multilayer wiring plate on which the plating layer is formed to couple a plurality of wiring layers of two or more layers. The hole for through-hole is a through hole to form a through-hole prior to the formation of the plating layer. In addition to the through-hole forming the plating layer on the surface inside the hole of the hole for through-hole, the through-hole includes a filled-via where the inside of the hole is entirely plugged up with the plating layer. The through-hole with the diameter from one-third to equivalent to the thickness of the insulating layer ensures easy formation of the filled-via. Note that, the smaller diameter compared with the thickness of the insulating layer is likely to generate the void by the conventional method.

An electroless plating layer serving as a base layer of the electrolytic filled plating layer is an electroless plating layer disposed on the entire surface of a surface of a board after the hole for through-hole is disposed. The electroless plating layer is plated to, for example, the surfaces of the metal foils on both sides of the insulating layer, and the side surfaces inside the hole of the hole for through-hole. This electroless plating layer can be formed using thin attachment type electroless copper plating solution, which is generally used to produce the multilayer wiring boards.

The electrolytic filled plating layer is an electrolytic plating layer formed by the electrolytic filled via plating solution. The thickness of the electrolytic filled plating layers at the first time on the metal foils on both sides of the insulating layer is preferably in a range of 1 to 10 μm and more preferably in a range of 2 to 5 μm. It is only necessary that the electrolytic filled plating layers at the second time on the metal foils on both sides of the insulating layer have the thickness where the electrolytic filled plating layers can be used as the wirings and the hole for through-hole can be completely plugged up with the electrolytic filled plating layer. The thickness of the electrolytic filled plating layers at the second time on the metal foils on both sides of the insulating layer is preferably in a range of 1 to 100 µm and more preferably in a range of 10 to 50 µm.

The electrolytic filled via plating solution is generally an addition of the plating inhibitor, which restrains the growth of the plating during a copper sulfate plating bath, and the plating accelerator, which accelerates the growth of the plating.

It is said that the plating inhibitor has the following effects. In association with a diffusion principle of substances, the plating inhibitor is less likely to be absorbed to the inside of the hole for through-hole and is likely to be absorbed to the board surface. Applying this principle, slowing a plating growth rate at the board surface compared with the plating growth rate at the inside of the hole for through-hole fills the inside of the hole for through-hole with the electrolytic filled copper plating layer. Thus, the electrolytic filled copper plating layer smooth to the board surface is formed at a part immediately above the hole for through-hole and a part other than the part immediately above the hole for through-hole. As the plating inhibitor, a polyether compound such as a polyalkylene glycol; a nitrogen-containing compound such as a quaternized polyvinylimidazolium and a copolymer of a vinyl pyrrolidone and a quaternized vinyl imidazolium, and the like are applicable.

It is said that the plating accelerator has the following effects. The plating accelerator is evenly absorbed to the side surfaces inside the hole for through-hole and the board surface. Subsequently, using a distribution of the accelerator in the hole for through-hole being dense due to the decreased surface area in association with the growth of the plating inside the hole for through-hole, a plating rate inside the hole for through-hole is set faster than a plating rate at the board surface and the inside of the hole for through-hole is filled with the electrolytic filled copper plating layer. Thus, the electrolytic filled copper plating layer smooth to the board surface is formed at the part immediately above the hole for through-hole and the part other than the part immediately above the hole for through-hole. As the plating accelerator, a sulfur compound expressed by 3-mercapto-1-propanesulfonic acid sodium salt or a sodium 2-mercaptoethanesulfonate; or a sulfur compound expressed by a bis-(3-sulfopropyl)-disulfide disodium and the like can be used. These plating accelerators are also one kind of a dopant added to copper plating solution referred to as a brightener.

The above-described plating inhibitor and the plating accelerator are used by one kind or a mixture of two kinds or more. The concentration of these water solutions is not especially limited. Note that, these water solutions can be used at the concentration of several ppm by mass to several mass %.

Figure 2:
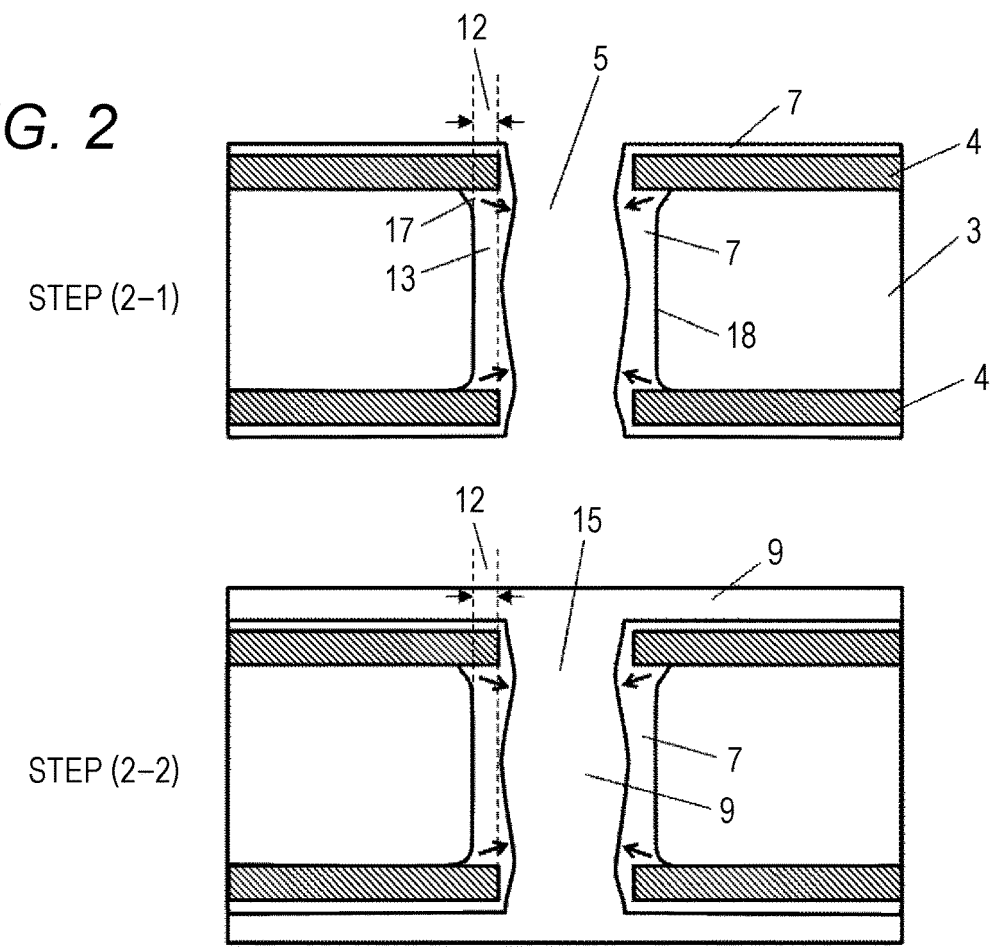
FIG. 2 illustrates a step (2) of the method for manufacturing the multilayer wiring board of one embodiment (the first embodiment to the fifth embodiment) of the present invention.

The following describes the method for manufacturing the multilayer wiring board of one embodiment of the present invention with reference to FIGS. 1 to 3.

First, as illustrated in a step (1-1) in FIG. 1, a copper foil-pasted laminated plate 22 where a prepreg 3 and copper foils 4 for a wiring 10 on both sides of the prepreg 3 are integrally laminated is prepared. Blackened layers (not illustrated) are disposed on the copper foils 4 for the wiring 10. Thereafter, as illustrated in a step (1-2) in FIG. 1, a hole for through-hole 5 is disposed by direct laser processing. Projections 12 of the copper foils 4 for the wiring 10 are generated at an opening of the hole for through-hole 5. A lower space 13 is formed between the projections 12 of the copper foils 4 for the wiring 10 and an inner wall 18 of the hole for through-hole 5. An amount of projection (a length of the projection) of this copper foil 4 is 3 to 10 µm. A just-below portion 17 is formed at a region near a back surface of the projections 12 of the copper foils 4 for the wiring 10 in the lower space 13, which is formed between the projections 12 of the copper foils 4 for the wiring 10 and the inner wall 18 of the hole for through-hole 5. This embodiment uses the prepreg 3, which is a resin film containing the reinforcing base material such as a glass fiber, as the insulating layer 3 to which the copper foils 4 for the wiring 10 are bonded. As the insulating layer 3, in addition to this prepreg 3, a high polymer epoxy resin or a resin film such as a thermoplastic polyimide bonding film that does not contain the reinforcing base material used for the general multilayer wiring board is applicable. This embodiment uses the copper foil 4 as the metal foil 4 for the wiring 10. In addition to this, as the metal foil 4, a nickel foil and an aluminum foil used as a material of the multilayer wiring board, a composite foil of these materials, and the like are applicable. The insulating layer 3 and the metal foil 4 may be formed using a one-surface-copper-foil-attached resin film where the resin film that contains the reinforcing base material or the resin film that does not contain the reinforcing base material is disposed on the copper foil 4.

As a method for integrally laminating the copper foils on both sides of the prepreg, a method for laminating and pressing the prepreg and the copper foils is applicable. The thickness of the insulating layer is around 60 to 300 µm and preferably 100 to 150 µm. The thickness of the copper foils is 3 to 12 µm.

The blackened layers formed on the copper foils for wiring can be formed by known blackened layers formed for bonding between the copper foils and the insulating layer in the general multilayer wiring board. As such blackened layer, a blackened layer formed by forming unevenness on the surface of the copper foil by copper oxide process or etching is listed.

As a laser applicable to form the hole for through-hole, a gas laser such as $CO_2$, CO, and an excimer and a solid laser such as YAG are available. With the $CO_2$ laser, a large output can be easily obtained. The direct laser method whose development has been advanced recently ensures the process of the hole for through-hole with the diameter of 50 µm or less.

Next, half etching is performed using etchant such as a ferric chloride solution, a sodium persulfate, or a sulfuric acid-hydrogen peroxide solution mixed water solution until the thickness of the copper foils 4 for the above-mentioned wiring 10 becomes around 1 to 5 µm. This process removes the blackened layers (not illustrated) formed on the copper foils 4.

Next, a desmear process is performed to remove a resin residue at the wall surface of the hole for through-hole. Afterwards, catalyst nuclei are given on the copper foils and inside of the hole for through-hole. Afterwards, the electroless copper plating layer (not illustrated) is formed. For example, the catalyst nuclei are given using activator neo Gantt (a product name manufactured by Atotech Japan K. K., "neo Gantt" is the registered trademark.), which is a palladium ion catalyst, or HS201B (a product name manufactured by Hitachi Chemical Co., Ltd.), which is a palladium colloid catalyst. An amount of absorption of the above-mentioned palladium catalyst on the copper foils 4 in this embodiment is in a range of 0.03 to 0.6 μg/cm² and more preferably in a range of 0.05 to 0.3 μg/cm². The process temperature when the palladium catalyst is absorbed is preferably 10 to 40° C. Regulating the processing period ensures regulating the amount of absorption of the palladium catalyst on the copper foils.

For the formation of the electroless copper plating layer, commercially available electroless copper plating solution such as CUST2000 (a product name manufactured by Hitachi Chemical Co., Ltd., "CUST" is the registered trademark.) and CUST201 (a product name manufactured by Hitachi Chemical Co., Ltd.) is applicable. These electroless copper plating solutions contain a copper sulfate, a formalin, a complexing agent, and a sodium hydroxide as the main components. It is only necessary that the thickness of the electroless copper plating layer is the thickness with which power feeding to form the next electrolytic filled copper plating layer can be performed. The thickness is in a range of 0.1 to 5 μm and more preferably in a range of 0.5 to 1.0 μm.

Next, as illustrated in a step (2-1) in FIG. 2, an electroless copper plating layer (not illustrated) is formed and an electrolytic filled copper plating layer 7 on a first stage to the extent by which the hole for through-hole 5 is not completely plugged up is formed on the electroless copper plating layer. In detail, a state of the lower space 13 filled with the electrolytic filled copper plating layer 7 on the first stage is achieved. Regarding the thickness of the electrolytic filled copper plating layer 7, the thickness of the electrolytic filled copper plating layers 7 inside the hole for through-hole 5 becomes thicker than the thickness of the electrolytic filled copper plating layers 7 on the copper foils 4 on both sides of the insulating layer 3. The thickness of the electrolytic filled copper plating layers 7 on the copper foils 4 on both sides of the insulating layer 3 is in a range of 1.0 to 5.0 μm. The thickness of the electrolytic filled copper plating layers 7 inside the hole for through-hole 5 is configured in a range of around 1.5 to 20 μm. The conditions for such electrolytic filled copper platings are: the current density of 1.0 A/dm² and around 4 to 20 minutes.

Next, the current density of the electrolytic filled copper plating on the first stage is once decreased to 0.3 A/dm² or less in the middle of the electrolytic filled copper plating of the first stage. The electrolytic filled plating with the decreased current density is performed for about one minute. In view of this, the plating accelerator absorbed to the electrolytic filled plating layer formed in the lower space can be separated. As long as the period during which the electrolytic filled plating is performed with the decreased current density, that is, the period during which the current density of the electrolytic filled copper plating is once decreased and held is one second or more, the effect of separating the plating accelerator is obtained. This period being within 10 minutes avoids work efficiency of the electrolytic filled copper plating to be deteriorated so much and therefore is preferable. Regarding the cross-sectional shape of a through-hole 15 immediately before the current density is once decreased, as illustrated in the step (2-1) in FIG. 2, the lower space 13, which is formed between the projections 12 of the copper foils 4 for the wiring 10 and the inner wall 18 of the hole for through-hole 5, is filled with the electrolytic filled copper plating layer 7 on the first stage. Thus, the cross-sectional shape of the through-hole 15 after the electrolytic filled plating layer 7 on the first stage is formed is in the state where the lower space 13 is filled with the electrolytic filled plating layer 7 on the first stage. In view of this, the plating inhibitor is likely to be absorbed to the opening of the hole for through-hole 5 corresponding to the just-below portion 17 of the copper foil 4. Meanwhile, the plating accelerator is likely to be absorbed to the inside of the hole for through-hole 5.

Next, the current density of the electrolytic filled plating is increased to 1.0 A/dm² again and the electrolytic filled copper plating for the second stage is performed. As illustrated in a step (2-2) in FIG. 2, in the electrolytic filled plating for the second stage after the current density of the electrolytic filled plating is increased again, the growth of the electrolytic filled plating layer 9 on the second stage starting from the just-below portion 17 is restrained. Accordingly, the electrolytic filled plating layer 9 on the second stage is preferentially formed at the inside of the hole for through-hole 5 without covering the opening of the hole for through-hole 5 by the electrolytic filled plating layer 9 on the second stage. Accordingly, the plating void in the electrolytic filled plating layer 9 on the second stage can also be restrained to the hole for through-hole 5 with the diameter equivalent to the thickness of the insulating layer 3. The inside of the hole for through-hole 5 is completely plugged up with this electrolytic filled copper plating layer 9 on the second stage. A part on the hole for through-hole 5 becoming the wiring 10 and a part other than the hole for through-hole 5 flatten. As the electrolytic filled plating layer 9 on the second stage, copper sulfate electroplating for a filled-via used for the usual multilayer wiring board is applicable. The electrolytic filled plating layer 9 on the second stage may be the electrolytic filled via plating solution used when the electrolytic filled copper plating layer 7 on the first stage is formed or may be different from this. As long as the electrolytic filled copper plating solutions used to form the electrolytic filled copper plating layer 7 on the first stage and the electrolytic filled copper plating layer 9 on the second stage are identical, the electrolytic filled copper plating on the first stage, the electrolytic filled copper plating where the current density is decreased, and the electrolytic filled copper plating on the second stage can be formed while they are immersed in the identical electrolytic filled copper plating solution. This brings good work efficiency. It is only necessary that the electrolytic filled plating layer 9 on the second stage has the thickness with which the electrolytic filled plating layer 9 is usable as the wiring and the through-hole can be plugged up with a conductive metal. The thicknesses of the electrolytic filled plating layer 9 on the second stage on the copper foils 4 on both sides of the insulating layer 3 and the electrolytic filled copper plating layer 7 on the first stage is preferably in a range of 1 to 20 μm and more preferably in a range of 1 to 5 μm. The conditions for such electrolytic filled copper plating are: around 4 to 90 minutes, preferably around 4 to 22 minutes at the current density of 1.0 A/dm². Generally, the copper deposits on the wall surface and the front surface of the hole for through-hole in the electrolytic filled copper plating to the same extent. In view of this, an aspect to plug up the inside of the hole for through-hole with the electrolytic filled copper plating layer 9 on the second stage is increased.

This embodiment plugs up the hole for through-hole by the formation of the electrolytic filled plating layer, dividing the plugging into two stages. Note that, the plugging of the hole for through-hole is not limited to the two stages but may be performed with the plugging being divided into two or more stages. In the case where the plugging of the hole for through-hole is performed with the plugging being divided into the two or more stages, once decreasing the current density of the electrolytic filled copper plating before the formation of the respective electrolytic filled plating layers on the second stage and later stages further facilitates restraining the void.

Next, using a dry film resist and the like, an etching resist is formed. The etching resist is removed from a site except for a site on the hole for through-hole and a site becoming the wiring through development.

Next, as illustrated in a step (3) in FIG. 3, the part other than the wiring 10 is removed by etching. Afterwards, using an alkaline stripping solution, a sulfuric acid, or a commercially available resist stripping solution, the etching resist (not illustrated) is peeled to form the wiring 10. The above-described method completes a multilayer wiring board 23 that includes the two-layered wiring 10 where the wiring 10 on both sides of the insulating layer 3 are mutually electrically connected with the through-hole 15. To fabricate the multilayer wiring board 23 including the wiring 10 with the larger number of layers, the surface of the wiring 10 of this multilayer wiring board 23 is, for example, roughened to improve adhesiveness with the insulating layer (not illustrated) formed on this wiring 10 and the prepreg and the copper foils are, for example, laminated.

EMBODIMENTS

The following describes the present invention based on the embodiments. Note that the present invention is not limited to these embodiments.

First Embodiment

First, as illustrated in the step (1-1) in FIG. 1, a copper foil-pasted laminated plate (thickness: 0.11 mm) formed by integrally laminating the copper foils 4 for the wiring 10 on both sides of the insulating layer 3 was prepared. Next, blackened layers (not illustrated) with the thickness of 0.3 to 0.5 μm were formed on the surfaces of the copper foils 4. Thereafter, as illustrated in the step (1-2) in FIG. 1, the direct laser method by the $CO_2$ laser processed the hole for through-hole 5 with the diameter of 60 μm. The aspect ratio of the hole for through-hole was about 1.8. The projections 12 of the copper foils 4 occurred at the opening of the hole for through-hole 5. The lower space 13 was formed between the projections 12 of the copper foils 4 and the inner wall 18 of the hole for through-hole 5. The amount of projection of the copper foil 4 was about 8 μm on one side of the hole for through-hole 5. The just-below portion 17 was formed at the region near the back surface of the projections 12 of the copper foils 4 for the wiring 10 in the lower space 13, which was formed between the projections 12 of the copper foils 4 for the wiring 10 and the inner wall of the hole for through-hole 5.

Next, using an etchant such as a ferric chloride solution, an ammonium persulfate, or a sulfuric acid-hydrogen peroxide solution mixed water solution, the half etching was performed to remove the blackened layers on the copper foils until the thickness of the copper foils became 2 to 3 μm.

Next, by performing the desmear process, the resin residue attached to the through-hole wall surface was removed. Using HS201B (a product name manufactured by Hitachi Chemical Co., Ltd.) as a palladium colloid catalyst, the catalyst nuclei were given on the copper foils and inside of the hole for through-hole. Afterwards, using CUST2000 (a product name manufactured by Hitachi Chemical Co., Ltd., "CUST" is the registered trademark.), an electroless copper plating layer with the thickness of 0.5 μm serving as the base layer of the electrolytic filled copper plating was formed.

Next, as illustrated in the step (2-1) in FIG. 2, the electrolytic filled copper plating layer 7 on a first stage that had the thickness of 2 μm on the copper foils 4 and the thickness of 2 to 5 μm at the center in the hole for through-hole 5 was formed. As the electrolytic filled copper plating solution, a commercially available direct-current electrolytic plating solution, CU-BRITE VFIV (a product name manufactured by JCU CORPORATION) was used. At this time, conditions for the electrolytic filled copper plating on the first stage were: about 8 minutes at the current density of 1.0 $A/dm^2$. At this time, a cross-sectional shape of the through-hole 15 when the electrolytic filled copper plating layer 7 on the first stage was formed was in a state where the lower space 13 was filled with the electrolytic filled plating layer 7 on the first stage.

Next, to once decrease the current density of the electrolytic filled copper plating, a rectifier was once powered off and was left for one minute remained at 0 $A/dm^2$. Afterwards, continuously, as illustrated in the step (2-2) in FIG. 2, the hole for through-hole 5 was filled with the electrolytic filled copper plating layer 9 on the second stage that had the thickness of 22 μm on the copper foils 4 and the electrolytic filled copper plating layer 7 on the first stage. The conditions for the electrolytic filled copper plating on the second stage at this time were: about 100 minutes at the current density of 1.0 $A/dm^2$. During this time, the board was remained immersed in the electrolytic filled copper plating solution.

Next, using SL-1229 (Hitachi Chemical Co., Ltd., a product name) as a dry film resist, the etching resist with the thickness of 29 μm was formed. The etching resist was removed from a site except for a site on the hole for through-hole and a site becoming the wiring 10. Next, as illustrated in the step (3) in FIG. 3, the copper other than the wiring 10 was removed by etching. Afterwards, using the alkaline stripping solution, the sulfuric acid, or the commercially available resist stripping solution, the etching resist was peeled to form the wiring 10.

Second Embodiment

Similar to the first embodiment, the step was advanced from the step (1-1) in FIG. 1 to the step (2-1) in FIG. 2. Next, as illustrated in the step (2-2) in FIG. 2, the electrolytic filled copper plating layer 7 on the first stage that has the thickness of 2 μm on the copper foils 4 and the thickness of 2 to 5 μm at the center in the hole for through-hole 5 is formed. As the electrolytic filled copper plating solution, the solution identical to that of the first embodiment was used. The conditions for the electrolytic filled copper plating on the first stage at this time were: about eight minutes at the current density of 1.0 $A/dm^2$.

Next, the current density of the electrolytic filled copper plating was reduced from 1.0 $A/dm^2$ to 0.3 $A/dm^2$, and the electrolytic filled copper plating was continued while the state was held for one minute. Afterwards, continuously, as illustrated in the step (2-2) in FIG. 2, the through-hole 15 was filled with the electrolytic filled copper plating layer 9 on the second stage that had the thickness of 22 μm on the copper foils 4 and the electrolytic filled copper plating layer 7 on the first stage. The conditions for the electrolytic filled copper plating on the second stage at this time were: about 100 minutes at the current density of 1.0 $A/dm^2$. During this time, the board was remained immersed in the electrolytic filled copper plating solution. Next, similar to the first embodiment, the step was advanced up to the step (3) in FIG. 3.

Third Embodiment

Similar to the first embodiment, the step was advanced from the step (1-1) in FIG. 1 to the step (2-1) in FIG. 2. Next, as illustrated in the step (2-2) in FIG. 2, the electrolytic filled copper plating layer 7 on the first stage that has the thickness of 2 μm on the copper foils 4 and the thickness of 2 to 5 μm at the center in the hole for through-hole 5 is formed. As the electrolytic plating solution, the solution identical to that of the first embodiment was used. The conditions for the electrolytic filled copper plating on the first stage at this time were: about eight minutes at the current density of 1.0 A/dm$^2$.

Next, the current density of the electrolytic filled copper plating was reduced from 1.0 A/dm$^2$ to 0.5 A/dm$^2$, and the electrolytic filled copper plating was continued while the state was held for one minute. Afterwards, continuously, as illustrated in the step (2-2) in FIG. 2, the hole for through-hole 5 was filled with the electrolytic filled copper plating layer 9 on the second stage that had the thickness of 22 μm on the copper foils 4 and the electrolytic filled copper plating layer 7 on the first stage. The conditions for the electrolytic filled copper plating on the second stage at this time were: about 100 minutes at the current density of 1.0 A/dm$^2$. During this time, the board was remained immersed in the electrolytic filled copper plating solution. Next, similar to the first embodiment, the step was advanced up to the step (3) in FIG. 3.

Fourth Embodiment

Similar to the first embodiment, the step was advanced from the step (1-1) in FIG. 1 to the step (2-1) in FIG. 2. Next, as illustrated in the step (2-2) in FIG. 2, the electrolytic filled copper plating layer 7 on the first stage that has the thickness of 2 μm on the copper foils 4 and the thickness of 2 to 5 μm at the center in the hole for through-hole 5 is formed. As the electrolytic plating solution, the solution identical to that of the first embodiment was used. The conditions for the electrolytic filled copper plating on the first stage at this time were: about eight minutes at the current density of 1.0 A/dm$^2$.

Next, the rectifier was once powered off to change the current density of the electrolytic filled copper plating from 1.0 A/dm$^2$ to 0 A/dm$^2$. The electrolytic filled copper plating was left for one minute in this state and the electrolytic filled copper plating was continued again. Afterwards, continuously, as illustrated in the step (2-2) in FIG. 2, the hole for through-hole 5 was filled with the electrolytic filled copper plating layer 9 on the second stage that had the thickness of 22 μm on the copper foils 4 and the electrolytic filled copper plating layer 7 on the first stage. The conditions for the electrolytic filled copper plating on the second stage at this time were: about 66 minutes at the current density of 1.5 A/dm$^2$. During this time, the board was remained immersed in the electrolytic filled copper plating solution. Next, similar to the first embodiment, the step was advanced up to the step (3) in FIG. 3.

Fifth Embodiment

Similar to the first embodiment, the step was advanced from the step (1-1) in FIG. 1 to the step (2-1) in FIG. 2. Next, as illustrated in the step (2-2) in FIG. 2, the electrolytic filled copper plating layer 7 on the first stage that has the thickness of 1 μm on the copper foils 4 and the thickness of 1 to 7 μm at the center in the hole for through-hole 5 is formed. As the electrolytic filled via plating solution, the solution identical to that of the first embodiment was used. The conditions for the electrolytic filled copper plating on the first stage at this time were: about four minutes at the current density of 1.0 A/dm$^2$.

Next, the current density of the electrolytic filled copper plating was reduced from 1.0 A/dm$^2$ to 0 A/dm$^2$, and the state was held for one minute. Next, continuously, as illustrated in the step (2-2) in FIG. 2, the electrolytic filled copper plating on the second stage that had the thickness of 2 μm on the copper foils 4 and the electrolytic filled copper plating layer 7 on the first stage was performed. The current density of the electrolytic filled copper plating was reduced again from 1.0 A/dm$^2$ to 0 A/dm$^2$, and the state was held for one minute. Furthermore, an electrolytic filled copper plating for a third stage with 20 μm was performed on the electrolytic filled copper plating layer 9 on the second stage to fill the hole for through-hole 5. The conditions for the electrolytic filled copper plating on the third stage at this time were: about 92 minutes at the current density of 1.0 A/dm$^2$. During this time, the board was remained immersed in the electrolytic filled copper plating solution. Next, similar to the first embodiment, the step was advanced up to the step (3) in FIG. 3.

Sixth Embodiment

Similar to the first embodiment, the step was advanced from the step (1-1) in FIG. 1 to the step (2-1) in FIG. 2. Next, as illustrated in a step (2-2) in FIG. 4, the electrolytic filled copper plating layer 7 on the first stage that has the thickness of 0.5 μm on the copper foils 4 and the thickness of 0.5 to 3 μm at the center in the hole for through-hole 5 is formed. As the electrolytic filled copper plating solution, the solution identical to that of the first embodiment was used. The conditions for the electrolytic filled copper plating on the first stage at this time were: about two minutes at the current density of 1.0 A/dm$^2$. At this time, the cross-sectional shape of the through-hole 15 when the electrolytic filled copper plating layer 7 on the first stage was formed was in a state where the lower space 13 was not filled with the electrolytic filled copper plating layer 7 on the first stage and the surface of the electrolytic filled copper plating layer 7 at the just-below portion 17 was concave with respect to the center in the hole for through-hole 5.

Next, the current density of the electrolytic filled copper plating was reduced from 1.0 A/dm$^2$ to 0.5 A/dm$^2$, and the electrolytic filled copper plating was continued while the state was held for one minute. Afterwards, continuously, as illustrated in the step (2-2) in FIG. 4, the through-hole 15 was filled with the electrolytic filled copper plating layer 9 on the second stage that had the thickness of 23.5 μm on the copper foils 4 and the electrolytic filled copper plating layer 7 on the first stage. The conditions for the electrolytic filled copper plating on the second stage at this time were: about 106 minutes at the current density of 1.0 A/dm$^2$. During this time, the board was remained immersed in the electrolytic filled copper plating solution. Next, similar to the first embodiment, the step was advanced up to the step (3) in FIG. 3.

Comparative Example 1

Similar to the first embodiment, the step was advanced from the step (1-1) in FIG. 1 to the step (2-1) in FIG. 2. Next, as illustrated in a step (2-2) in FIG. 5, the electrolytic filled copper plating layer 7 on the first stage that had the thickness on the copper foils 4 of 25 μm was formed by one stage. As the electrolytic filled copper plating solution, the solution identical to that of the first embodiment was used. The conditions for the electrolytic filled copper plating on the first stage at this time were: about 108 minutes at the current density of 1.0 A/dm². Next, similar to the first embodiment, the step was advanced up to the step (3) in FIG. 3.

Table 1 summarizes a frequency of the plating void through observation of the cross-sectional surfaces of the through-holes of the first to the sixth embodiments and Comparative Example 1 with a microscope. The first to the fifth embodiments exhibited the frequency of void of 0%; therefore, the hole for through-hole was able to be filled. The sixth embodiment exhibited the frequency of void of 75%; therefore, the hole for through-hole was able to be almost filled. Meanwhile, Comparative Example 1 exhibited the generated void of almost 100%. In the first to the sixth embodiments where the current density was once decreased in the middle of the electrolytic filled copper plating, a stripe was observed between the electrolytic filled copper plating layer on the first stage and the electrolytic filled copper plating layer on the second stage. This stripe ensures identification of a boundary between the electrolytic filled copper plating layer on the first stage and the electrolytic copper plating layer on the second stage. Consequently, it was able to be confirmed that the cross-sectional shapes of the through-holes of the first to the fifth embodiments were in a state where the lower spaces were filled with the electrolytic filled copper plating layers on the first stage. It has been found that with the cross-sectional shape of the through-hole of the sixth embodiment, the lower space was not filled with the electrolytic filled copper plating layer on the first stage, the electrolytic filled copper plating layer on the second stage grows thick in the lower space starting from the just-below portion and covers the opening with the void left in some cases. Meanwhile, with the cross-sectional shape of the through-hole of Comparative Example 1, the stripe indicative of the boundary between the electrolytic filled copper plating layer on the first stage and the electrolytic copper plating layer on the second stage was not observed. It has been found that the electrolytic filled copper plating layer in the lower space starting from the just-below portion grows thicker than portions other than that inside the through-hole and covers the opening with the void left.

DESCRIPTION OF REFERENCE SIGNS

3: Prepreg or insulating layer
4: Metal foil or copper foil
5: Hole for through-hole
7: Electrolytic filled plating layer on first stage or electrolytic filled copper plating layer on first stage
9: Electrolytic filled plating layer on second stage or electrolytic filled copper plating layer on second stage
10: Wiring
12: Projection of metal foil
13: Lower space
15: Through-hole or interlaminar coupling
16: Void
17: Just-below portion
18: Inner wall
22: Metal foil-pasted laminated plate or copper foil-pasted laminated plate
23: Multilayer wiring board

The invention claimed is:

1. A method for manufacturing a multilayer wiring board, comprising:
a step (1) of disposing a hole for through-hole, a projection of metal foils, and a lower space, the hole for through-hole being formed on a metal foil-pasted laminated plate by a conformal method or a direct laser method, the metal foil-pasted laminated plate being formed by integrally laminating the metal foils on both sides of an insulating layer, the hole for through-hole passing through the metal foils on both the sides of the insulating layer and the insulating layer, the projection of the metal foils on both the sides of the insulating layer being formed at an opening of the hole for through-hole, the lower space being defined by the projections of the metal foils and by an inner wall of the hole for through-hole;
a step (2) of forming an electrolytic filled plating layer at an inside of the hole for through-hole and on the metal foils on both the sides of the insulating layer to plug up the hole for through-hole, the through-hole electrically connecting the metal foils on both the sides of the insulating layer mutually; and
a step (3) of forming a wiring by a circuit process of the metal foils on both the sides of the insulating layer after the formation of the electrolytic filled plating layer, wherein

TABLE 1

| Item | First Embodiment | Second Embodiment | Third Embodiment | Fourth Embodiment | Fifth Embodiment | Sixth Embodiment | Comparative Example 1 |
|---|---|---|---|---|---|---|---|
| Electrolytic Filled Plating on First Stage | 1.0 A/dm² × 8 min | 1.0 A/dm² × 8 min | 1.0 A/dm² × 8 min | 1.0 A/dm² × 8 min | 1.0 A/dm² × 4 min | 1.0 A/dm² × 2 min | 1.0 A/dm² × 108 min |
| Electrolytic Filled Plating Where Current was Decreased | 0 A/dm² × 1 min | 0.3 A/dm² × 1 min | 0.5 A/dm² × 1 min | 0.5 A/dm² × 1 min | 0 A/dm² × 1 min | 0.8 A/dm² × 1 min | — |
| Electrolytic Filled Plating on Second Stage | 1.0 A/dm² × 100 min | 1.0 A/dm² × 100 min | 1.0 A/dm² × 100 min | 1.5 A/dm² × 66 min | 1.0 A/dm² × 8 min | 1.0 A/dm² × 106 min | — |
| Electrolytic Filled Plating Where Current was Decreased | — | — | — | — | 0.8 A/dm² × 1 min | — | — |
| Electrolytic Filled Plating on Third Stage | — | — | — | — | 1.0 A/dm² × 92 min | — | — |
| Void Rate | 0% | 0% | 0% | 0% | 0% | 75% | 100% | wherein the step (2) is performed by a plating process comprising electrolytic plating at a first current density for a period of time, then, after the lower space is completely filled with the electrolytic filled plating layer and before formation of a plating void in the electrolytic filled plating layer, plating at a second current density lower than the first current density for a period of time, and then electrolytic plating at a third current density higher than the second current density for a period of time.

2. The method for manufacturing the multilayer wiring board according to claim 1, wherein
when the second current density is decreased by 50% or more from the first current density.

3. The method for manufacturing the multilayer wiring board according to claim 1, wherein
when the third current density is equal to or more than the first current density.

4. The method for manufacturing the multilayer wiring board according to claim 1, wherein
when the second current density is 0 A/dm².

5. A method for manufacturing a multilayer wiring board, comprising:
providing a metal foil laminated plate comprising metal foils laminated on respective sides of an insulating layer;
forming a through-hole through the metal foil laminated plate, the through-hole passing through the metal foils on the respective sides of the insulating layer and passing through the insulating layer, wherein the through-hole passing through the insulating layer has a larger diameter than the through-hole passing through the metal foils such that projections of the metal foils extend beyond the insulating layer and a lower space is defined by the projections of the metal foils and by an inner wall of the through-hole passing through the insulating layer;
forming a plating layer at an inside of the through-hole and on the metal foils on the respective sides of the insulating layer to plug up the through-hole and to electrically connect the metal foils on the respective sides of the insulating layer, wherein forming the plating layer is performed by a plating process comprising electrolytic plating at a first current density for a period of time, then, after the lower space is completely filled with the plating layer and before formation of a plating void in the plating layer, plating at a second current density lower than the first current density for a period of time, and then electrolytic plating at a third current density higher than the second current density for a period of time; and
forming a wiring by a circuit process of the metal foils on the respective sides of the insulating layer after the formation of the plating layer.

6. The method for manufacturing the multilayer wiring board according to claim 5, wherein
when the second current density is decreased by 50% or more from the first current density.

7. The method for manufacturing the multilayer wiring board according to claim 5, wherein
when the third current density is equal to or more than the first current density.

8. The method for manufacturing the multilayer wiring board according to claim 5, wherein
when the second current density is 0 A/dm².

* * * * *